United States Patent [19]
Kampmeier

[11] Patent Number: 5,981,963
[45] Date of Patent: Nov. 9, 1999

[54] ELECTRON-BEAM SYSTEM

[75] Inventor: Franz Kampmeier, Langenberg-Benteler, Germany

[73] Assignee: Bush Industries, Inc., Jamestown, N.Y.

[21] Appl. No.: 08/952,102

[22] PCT Filed: Mar. 10, 1997

[86] PCT No.: PCT/EP97/01215

§ 371 Date: Nov. 17, 1997

§ 102(e) Date: Nov. 17, 1997

[87] PCT Pub. No.: WO97/35325

PCT Pub. Date: Sep. 25, 1997

[30] Foreign Application Priority Data

Mar. 18, 1996 [DE] Germany ............................ 196 10 492

[51] Int. Cl.⁶ .................................................. H01J 37/30
[52] U.S. Cl. .................................. 250/492.3; 250/453.11; 250/515.1
[58] Field of Search ........................... 250/492.3, 453.11, 250/454.11, 515.1, 517.1

[56] References Cited

U.S. PATENT DOCUMENTS

| | | | |
|---|---|---|---|
| 3,433,947 | 3/1969 | Emanuelson et al. | 250/492.3 |
| 3,488,495 | 1/1970 | Schneeman | 250/515.1 |
| 3,499,141 | 3/1970 | Kingsley et al. | 250/492.3 |
| 4,020,354 | 4/1977 | Fauss et al. | 250/453.11 |
| 5,194,742 | 3/1993 | Avnery et al. | 250/492.3 |
| 5,396,074 | 3/1995 | Peck et al. | 250/453.11 |

*Primary Examiner*—Bruce C. Anderson
*Attorney, Agent, or Firm*—Webb Ziesenheim Logsdon Orkin & Hanson, P.C.

[57] ABSTRACT

An electron-beam system for curing plastic layers on workpieces has an irradiation chamber, an electron gun, a transport device for conveying workpieces into the irradiation chamber, and a shield as radiation protection. In order to achieve a high throughput of workpieces and effective shielding, provision is made of two or more blocking devices, which can be moved with reference to the transport device and which are arranged in each case as radiation protection on the transport device upstream and downstream of the irradiation chamber, specifically at a spacing in the conveying direction of the transport device in such a way that at least one workpiece fits between two blocking devices.

9 Claims, 9 Drawing Sheets

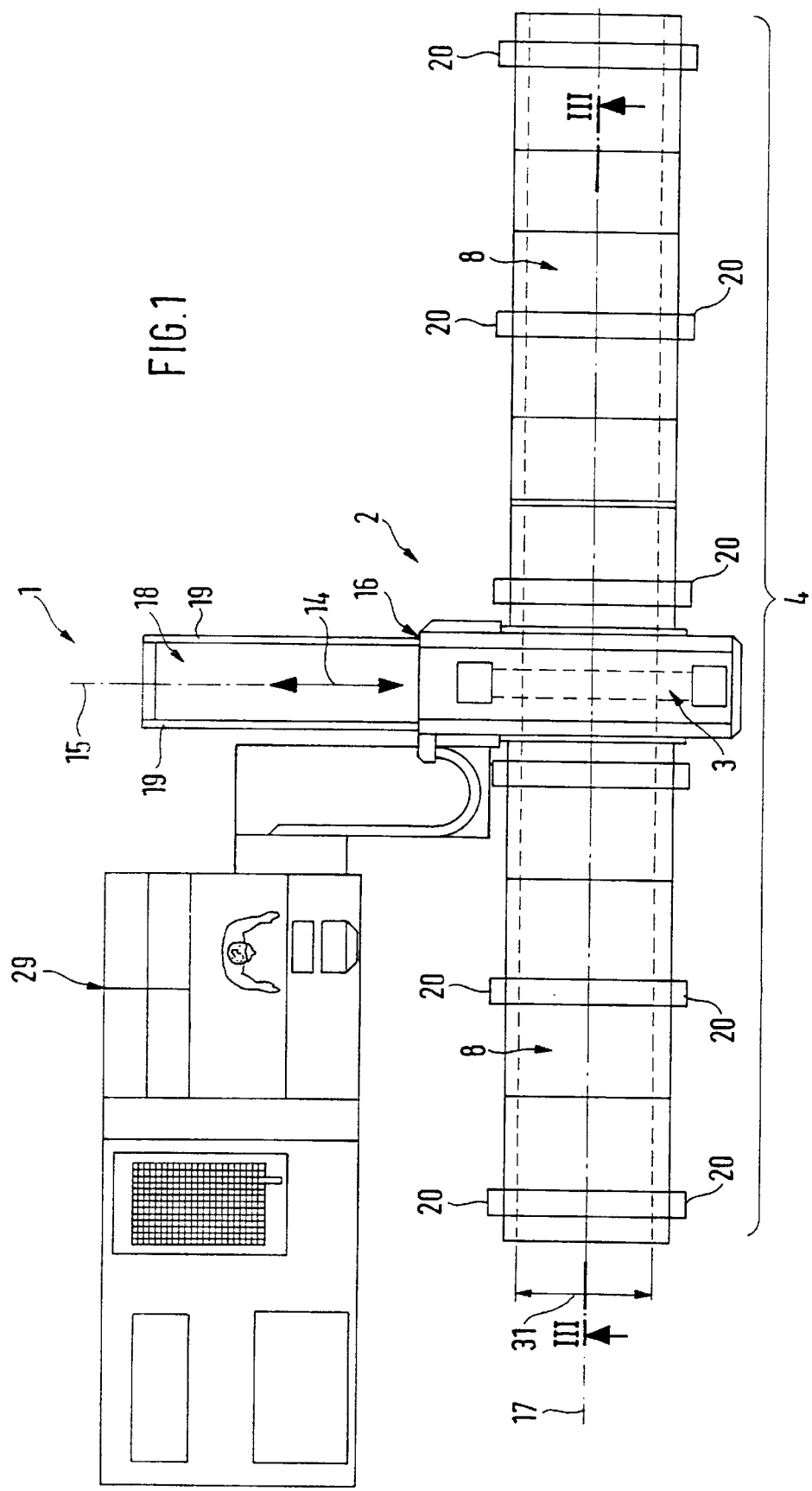

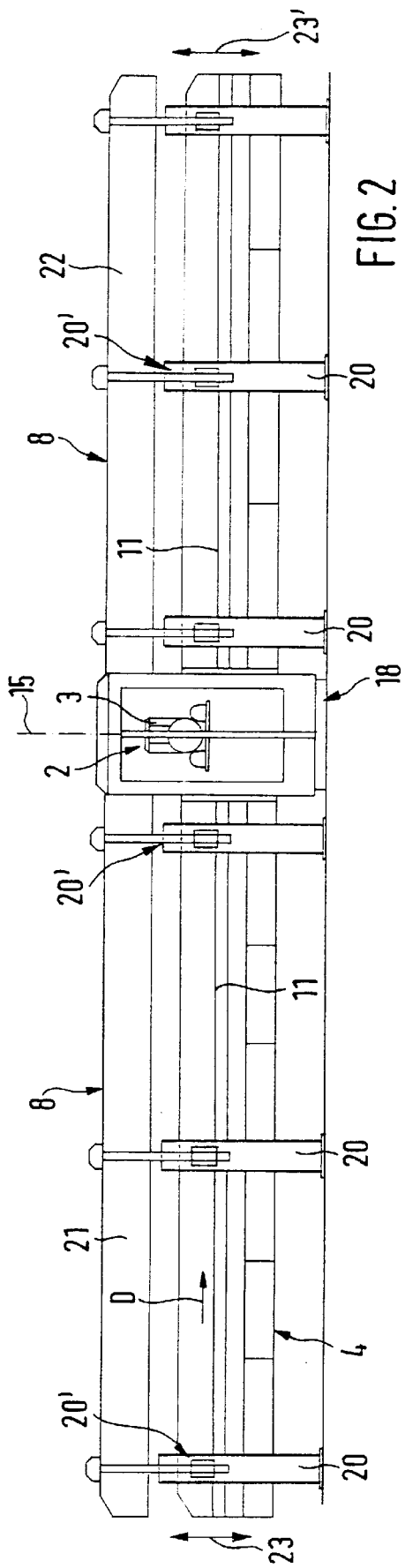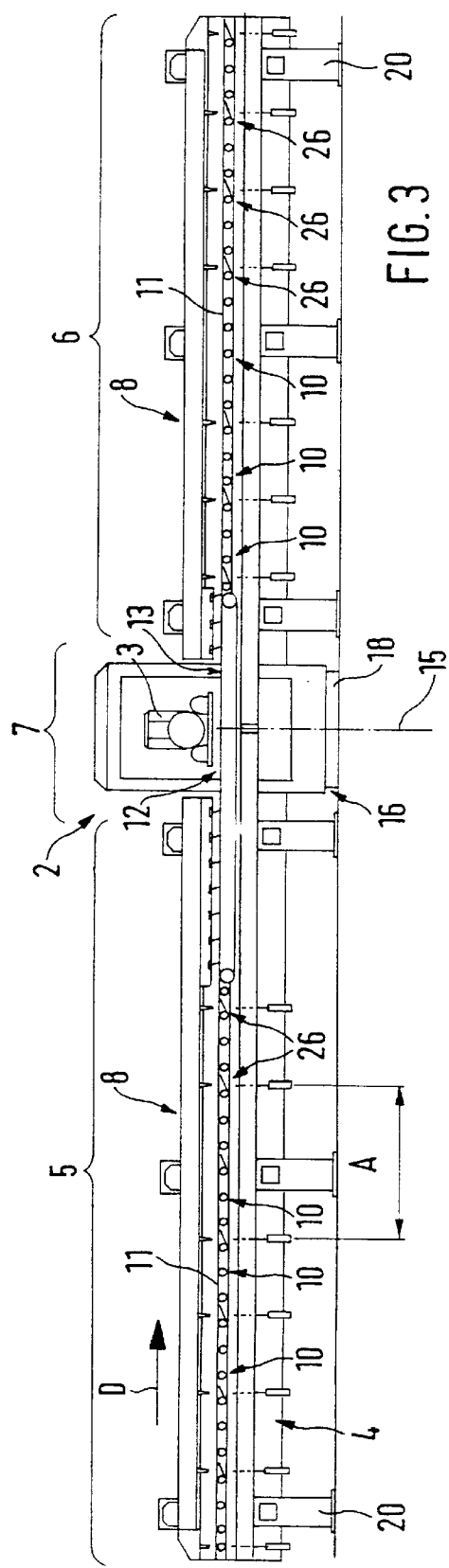

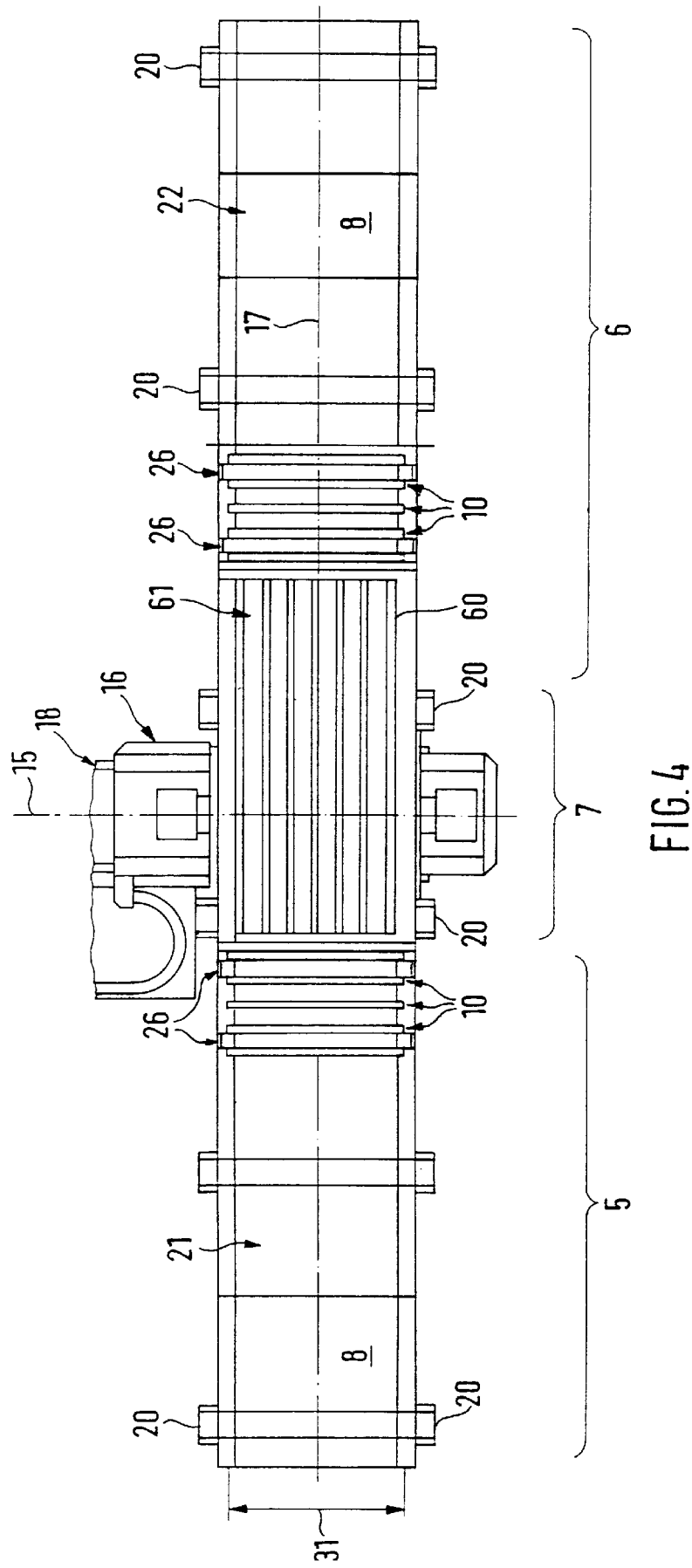

ial-proof fashion in a spherical recess near the irradiation chamber, and the workpieces fall onto a belt conveyor after irradiation. This system is suitable only for relatively small workpieces which are suitable for being conveyed in a rotary machine.

ELECTRON-BEAM SYSTEM

BACKGROUND OF THE INVENTION

1. Field of the Invention

The invention relates to an electron-beam system for curing plastic layers on workpieces, having an irradiation chamber, an electron gun for generating at least one electron beam in the irradiation chamber, a transport device for conveying the workpieces into the irradiation chamber and out of the irradiation chamber, and a shield as radiation protection.

2. Description of the Prior Art

An electron-beam system disclosed in DE-A-20 04 050 includes vertically displaceable blocking devices provided directly upstream and downstream of the irradiation chamber and are used to shield against radiation emerging undesirably from the chamber openings in the irradiation chamber through which the workpieces are pushed into the irradiation chamber or guided out of it. In this device, the workpieces running horizontally through the irradiation chamber must be conveyed in the manner of "stop-and-go" traffic, that is to say it is necessary in each case to introduce one workpiece into the irradiation chamber, and it is then necessary to close the irradiation chamber at both ends. The transport device has to be briefly stopped in this process. After irradiation of the workpiece has been performed in the irradiation chamber, the two blocking devices are opened at the inlet end and the outlet end of the irradiation chamber, so that the finally irradiated workpiece can be removed from the irradiation chamber and a fresh workpiece can be transferred into the irradiation chamber. In order that, in this prior art, no scattered radiation (essentially, X-ray radiation generated by the high-energy electrons) can emerge from the irradiation chamber through the openings while the blocking device is being opened, it is necessary to provide complicated means so as to shield the electron beam during these times of opening the irradiation chamber.

In another known electron-beam system (DE 44 06 887 C1), provision is made of an irradiation chamber which, for the purpose of conveying plate-shaped workpieces in and away, cooperates with a transport device which forms a feed section and a discharge section, in addition to a shielding jacket above its transport section said transport device having in each case a conveying means with a plurality of shielding plates as a horizontal shield. In order to shield off the scattered radiation emerging in the region of a through opening from the irradiation chamber, the conveying means forming an orbit can be used for the purpose of continuously guiding said shielding plates into or out of their shielding position. In order to move these heavy shielding plates synchronously with the workpieces, the conveying means is provided with a technically complex design which is complicated to manipulate in the case of adaptation to changes in workpiece size. With the shielding jacket in the double-layered region of transport device and conveying means, the overall system is very large, and with the modules described above an inner cavity is formed below the shielding jacket and causes a disadvantageously high consumption of protective gas. Moreover, an expensive demounting of the shielding jackets causes difficulty in accessing the system in the region of the processing section, for example for the purposes of repair and maintenance.

A further known electron-beam system (DE-A-17 64 592) describes (FIG. 12) a conveying device for the workpieces to be irradiated, in the form of a rotary machine having separate chambers. The rotary machine is guided in a It is the object of the invention to develop an electron-beam system of the type mentioned at the beginning in such a way that the system can achieve a high throughput of workpieces in conjunction with a low operating outlay, that the system can be adapted in a simple way to different workpiece dimensions, that reliable screening of the system against undesirable radiation is ensured, and that, in addition, it is also possible to save on the consumption of protective gas.

SUMMARY OF THE INVENTION

In accordance with an embodiment of the present invention an electron-beam system includes two or more blocking devices which can be moved with reference to the transport device and are arranged in each case as radiation protection on the transport device upstream and/or downstream of the irradiation chamber at a spacing in the conveying direction of the transport device such that at least one workpiece fits between the two or more blocking devices. It is is not necessary in this arrangement for the two blocking devices to be adjacent.

In accordance with another embodiment provision is made in the vicinity of the transport device upstream of the irradiation chamber, or else downstream of the irradiation chamber, of at least two blocking devices which prevent undesirable radiation which comes from the irradiation chamber from emerging into a region outside the electron-beam system. These blocking devices upstream or downstream of the irradiation chamber are arranged at such a spacing in the conveying direction of the transport device that at least one workpiece fits in each case between two blocking devices.

It is possible with such an electron-beam system to charge the irradiation chamber continuously with workpieces to be irradiated, and to remove irradiated workpieces from the chamber. The electron-beam system according to the invention thus permits continuous operation, but it can also be controlled in the manner of a "stop-and-go" operation.

It is preferred, in particular, to provide more than two blocking devices as radiation protection at the inlet end of the irradiation chamber and, if appropriate, also in a mirror-symmetric fashion at the outlet end of the irradiation chamber. Depending on the size of the workpiece, the blocking devices can then be operated by means of an electronic control in such a way that when a series of workpieces arranged at a spacing one behind another on the transport device is conveyed at least one blocking element can in each case be moved upstream and downstream of the irradiation chamber into a closed position between two succeeding workpieces. The control can be carried out, for example, in such a way that whenever no workpiece is situated in the region of a blocking device, said blocking device is brought into its closed position, in which it prevents scattered radiation from emerging. Such a control is, for example, fully automatic and has light barriers which determine the presence or the approach of a workpiece in the region of the blocking device and supply corresponding data to a computer which controls the blocking devices by means of a motor. Owing to the fact that, in accordance with the invention, two or more blocking devices are provided in the conveying direction of the transport device and, furthermore, that the workpieces can be deposited onto the transport device with a settable mutual spacing from a charging system, it is possible to ensure that during the feeding of the workpieces into the irradiation chamber always at least one blocking device, preferably even two or more blocking devices, are in their closed position, in which they prevent the undesirable emergence of radiation from the region of the electron-beam system. The invention thus also comprises a method for controlling an electron-beam system for the purpose described above.

Preferably the transport device includes a horizontal, essentially level, transport track for the workpieces, specifically both upstream and downstream of the irradiation chamber and, in an especially preferred fashion, continuously even in the irradiation chamber, so that on their way in the electron-beam system the workpieces are moved on a straight, horizontal track upstream of and downstream of the irradiation chamber. In particular, this permits large workpieces, in particular those of large area to be conveyed without any problem.

In another embodiment of the invention shields are arranged as radiation protection in the conveying direction of the transport device at both ends of the irradiation chamber, that is to say upstream and downstream of the irradiation chamber. The shields in each case cover the transport device and the vertical height of each shield can be set optionally. This permits workpieces of different dimensions to be processed in such a way that the shield can be set to be precisely adapted to the workpiece height for each workpiece. The result of this is that the vertical passing cross-section of the electron-beam system for the workpieces, that is to say that cross-section through which the workpieces are moved in the conveying direction, can be kept as small as possible, and thus the shielding effect of the shield is optimum.

In accordance with another embodiment of the invention, by means of a framework supporting it the electron gun can be displaced transverse to the conveying direction of the transport device out of the irradiation chamber into a position in which it is readily accessible for maintenance and repair work.

The electron-beam system according to the invention and with the blocking devices described has components which are easy to control, in particular the movable parts of the blocking devices, which are supported underneath or above a horizontal transport track of the transport device. As described, the passing cross-sections for the workpieces can be automatically opened in the conveying direction by moving synchronously with the feeding or discharging of the workpieces to the irradiation chamber or from the irradiation chamber, and can be immediately completely reclosed after a workpiece has passed. The moving parts of the blocking devices can in this case be moved from their open position from above and/or else from below into the vertical closed position, only short times being required for moving the blocking elements, with the result both that a highly effective radiation protection is achieved, and a lock-like obstacle is formed for the flow of the protective gas from the irradiation chamber, that is to say the blocking devices serving as radiation protection also effect a strong restriction of the emergence of protective gas from the irradiation chamber, and the consumption of protective gas is thereby greatly reduced.

The vertical adjustability, already described above, of shields which seal the transport device against the emergence of radiation upstream or downstream of the irradiation chamber also permits simple access to the transport device for the purposes of maintenance or repair. The shields can be raised as a whole (as a coherent subassembly) on either side of the irradiation chamber by means of a suitable lifting device. Again, the consumption of protective gas is reduced by the described adjustability of the shields to an optimum minimum height.

BRIEF DESCRIPTION OF THE DRAWINGS

FIG. 1 shows a top view of an electron-beam system according to the invention having a transport device arranged on both sides and a control system, FIG. 2 shows a side view of the electron-beam system in accordance with FIG. 1 having a shield, in the open position, situated above the transport device, FIG. 3 shows a sectioned side view of the electron-beam system, in the closed operating position, in accordance with a line III—III in FIG. 1, FIG. 4 shows a top view of the electron-beam system having a transport device, represented partially sectioned, in the region of the processing section.

DETAILED DESCRIPTION OF THE PREFERRED EMBODIMENT

Figure 5:
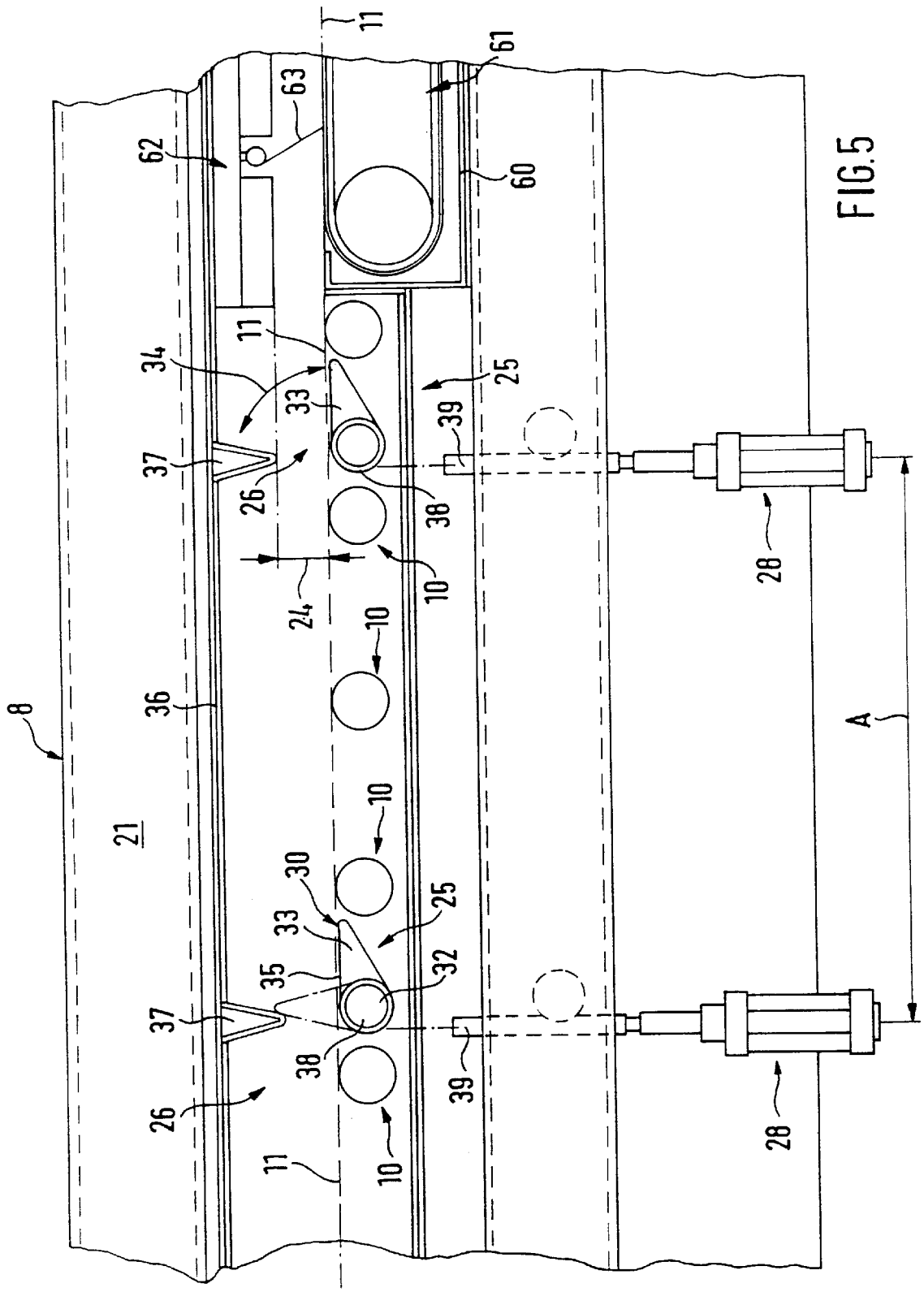
FIG. 5 shows an enlarged representation of a detail in the region of the transport device, with a blocking device, provided below the transport plane, in a first embodiment.

FIG. 1 shows an electron-beam system, denoted overall by 1, in a top view illustrating its overall design, an irradiation chamber 2 with an electron gun 3 being assigned to a transport device denoted overall by 4. The transport device 4 has a feed section 5, a discharge section 6 and a processing section 7 (FIG. 3), and above these subsections the entire transport device 1 is provided with a shield 8 which covers the individual components of the latter (FIG. 2).

The side views of FIGS. 2 and 3 illustrate that the transport device 4 defines by means of its transport elements 10 a horizontal transport track 11 on which respective plate-shaped workpieces (not represented) can, in particular for the purpose of curing plastic layers located on the latter, be guided via a feed opening 12 into the irradiation chamber 2, and can be removed via a discharge opening 13. The conveying direction is shown by arrows D.

The electron-beam system 1 according to the invention is represented in FIG. 1 in the operating position, the electron gun 3 arranged in the region of the irradiation chamber 2 being supported transverse (arrow 14) to the conveying direction D along a central longitudinal plane 15 on a framework 16 in such a way that at least the electron gun 3 can be displaced via a movement in the arrow direction 14 from the represented operating position into a maintenance position (not represented) which is next to the transport device 4 and accessible from all sides. This possibility of displacement perpendicular to the central longitudinal plane 17 of the transport device 4 produces overall an improved manipulation of the electron-beam system 1. Supporting the framework 16 on a base plate 18 by means of appropriate guiding parts 19 (FIG. 1) also permits the entire framework 16 to be displaced from the region of the processing section 7, and thus permits maintenance and/or conversion work on the system to be performed very flexibly and with little outlay.

In an advantageous embodiment, the shields 8 of the electron-beam system 1 are respectively constructed in the form of lifting units 21 and 22 in the region of the feed section 5 or discharge section 6. One lifting unit 21 or 22 spans, as a single-piece subassembly, the respective section of the transport device 4. In the representation in accordance with FIG. 2, movement arrows 23 and 23' illustrate the possibilities of vertical displacement of the two lifting units 21, 22, it being possible for these shields 8 to be adjusted simultaneously or independently by appropriately controlling lifting elements 20' supported on stand parts 20.

In the operating position in accordance with FIG. 3, the lifting units 21, 22 are lowered so far that the passing cross-section located above the transport track 11, or the height 24 of said cross-section (FIG. 5) can be set to a magnitude which is optimum for sealing, that is to say the height 24 is set as small as possible, so that the workpiece just fits to pass through. With this possibility of adjustment, the entire electron-beam system 1 is thoroughly variable, and can be adapted to different heights of the workpieces with little outlay in the case when products change. In the lowered operating position, the possibility that a protective gas provided in the irradiation chamber 2 for the purpose of rendering conditions inert escapes via the feed or discharge openings 12, 13, respectively, and the conveying sections is largely suppressed, and thus the consumption of gas by the system is low overall.

In the region of the feed and discharge openings 12, 13 and in the passing cross-section of the transport track 11, the overall concept of the electron-beam system 1 requires, in addition to the shield 8 of the transport device 4, a horizontal shield (that is to say, a shield which is also effective in the horizontal direction), which is provided as protection against scattered radiation and is formed by blocking devices 26 having an automatically controllable blocking element 25 (FIG. 5).

The representation of the principle in accordance with FIG. 5 illustrates in this case that the blocking devices 26 are respectively provided as constructional units arranged essentially below the transport track 11, and that the blocking element 25 can be moved from its open position located below the horizontal transport track 11 (FIG. 5, right-hand side) into the shielding position extending perpendicular to the transport track 11 and covering the passing cross-section or the height 24 thereof (FIG. 5, left-hand side, representation of the blocking element 25 by dashes). In an expedient embodiment, the transport device 4 is provided (FIG. 3) in the region both of the feed section 5 and of the discharge section 6 with a plurality of blocking devices, which are denoted in each case by 26 and which are arranged distributed at a freely selectable spacing A in the longitudinal direction of the conveying sections.

The blocking devices 26 in this case form overall individually controllable constructional units whose drive 28 is connected in each case to a control center 29 (FIG. 1), which can also be used to control the movement of the respective blocking element 25, for example as a function of workpiece dimensions or the like detected via appropriate light-barrier signals. In this case an electric, hydraulic or pneumatic drive can be provided for moving the blocking device 26 or the respective blocking element 25.

In the embodiment of the blocking element 25 in accordance with FIG. 5, said blocking element is constructed as a flap 30 which can be brought into the shielding position and which extends transversely over the entire width 31 of the transport device 4 (FIG. 4).

The flap 30 is provided with a transverse axis 32, which extends parallel to the transport elements 10, constructed as roller parts, below the transport track 11 and on which there is integrally formed a profiled wing 33 which acts as the direct blocking part, with the result that the blocking device 26 acts in the manner of a wing flap when movement is begun.

The side view in accordance with FIG. 5 shows, moreover, that after a pivoting movement through approximately 90° (arrow 34), the flap 30 can be laid with an upper profile flank 35 against a stop wing 37, which is arranged above the transport track 11 and is preferably supported on a cover part 36 of the lifting unit 21 or 22. This pivoting movement is communicated to the flap 30 by virtue of the fact that the drive 28, which is designed, in particular, as a lifting cylinder with a connecting rod 39, acts in the region of the transverse axis 32 at an eccentric hinge point 38. In the open position (FIG. 5, right-hand side), the profiled wing 33 is pivoted so far that the wing top side 35 extends near the transport track 11. In an expedient design, the flap 30 can be provided with a lead sheet cladding in the region of the wing 33, in order to improve the shielding action, and it is likewise conceivable to provide the stop wing 37 and/or the region of the wing top side 35 with a damping facing (not represented), so that disadvantageous instances of noise generation are avoided when the profiled wing 33 moves into the closed position, forming a sealing engagement, on the stop wing 37.

Figure 9:
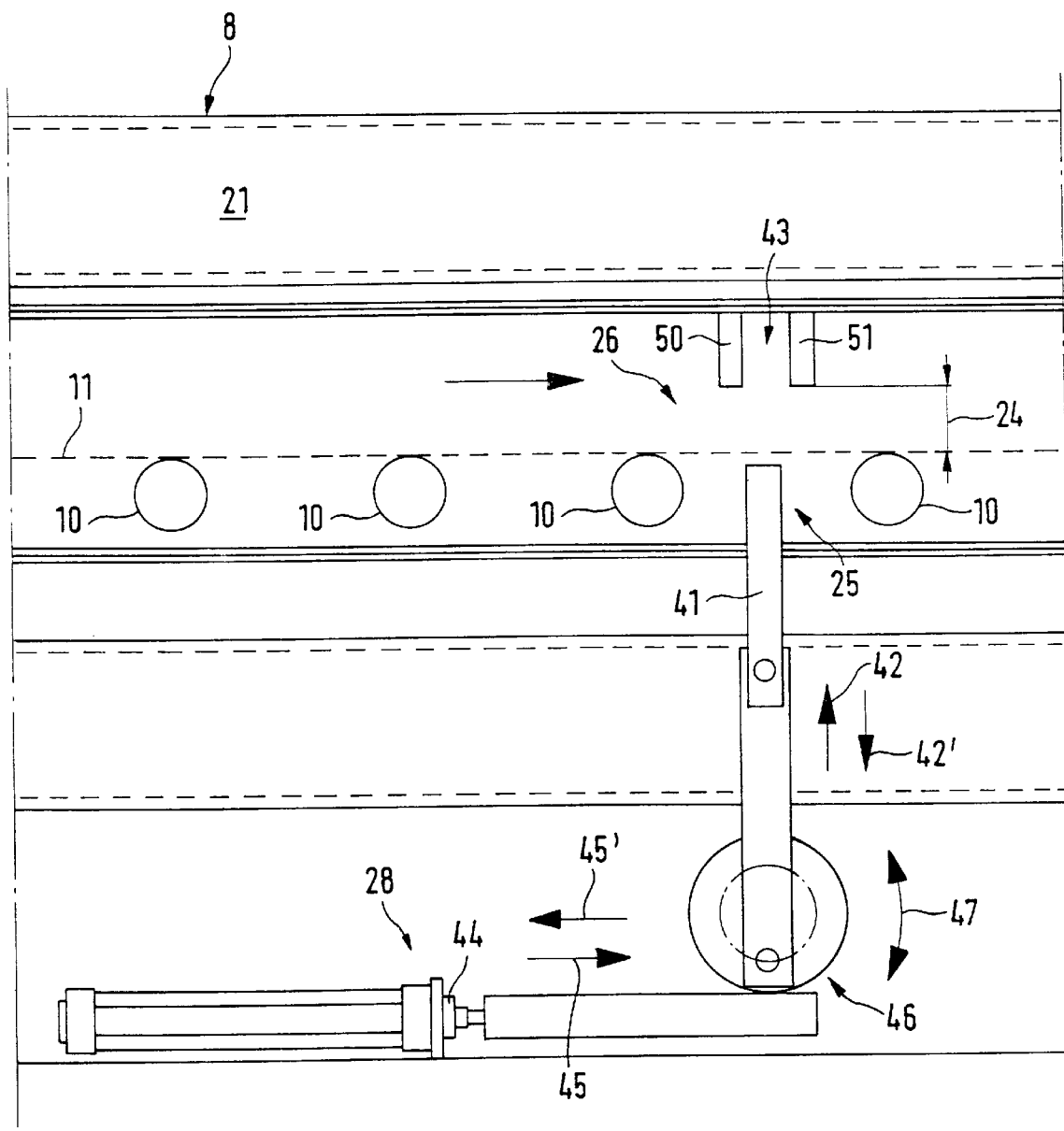
FIG. 9.
Figure 10:
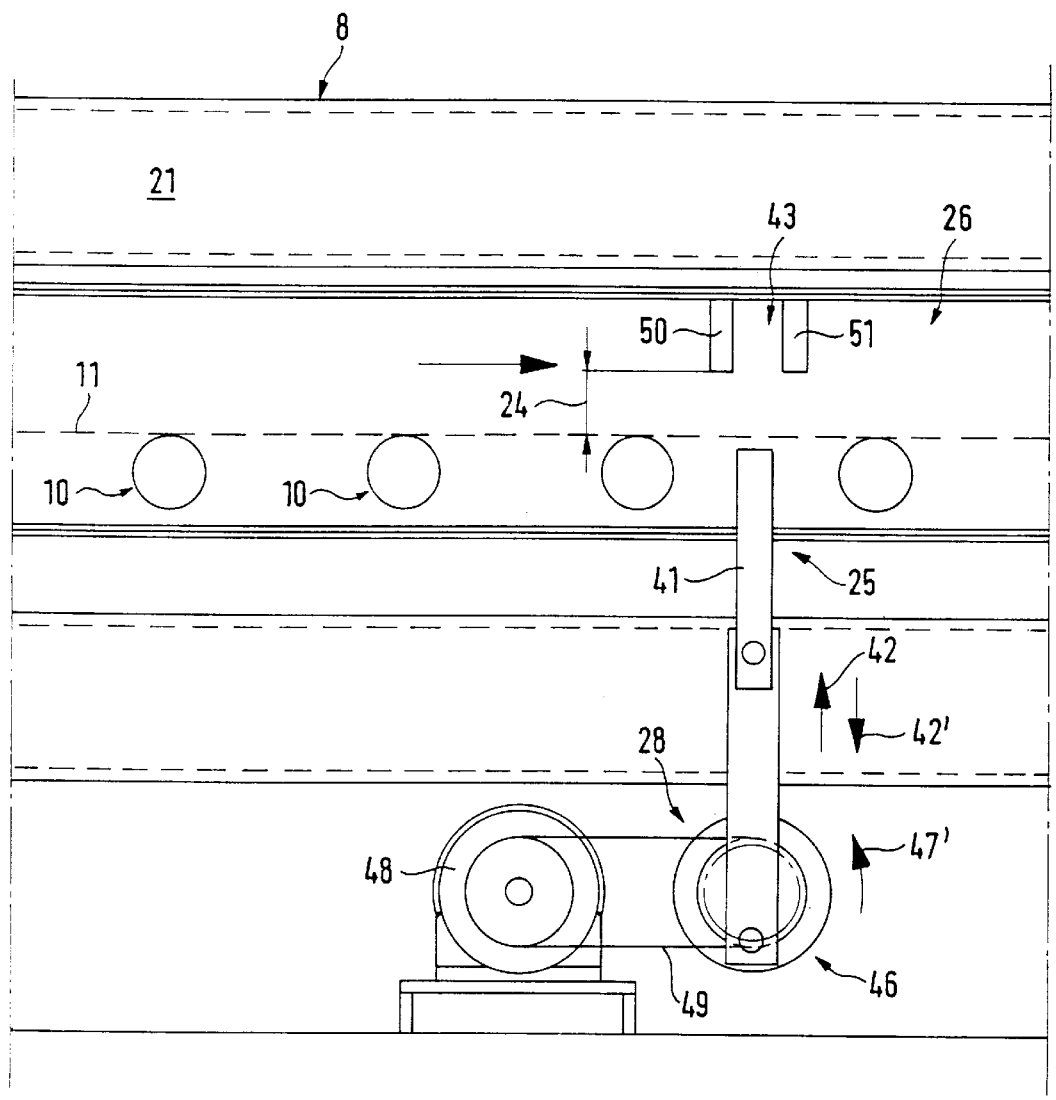
FIG. 10 show enlarged detailed representations of the blocking device in a third embodiment having a sliding element.

Further embodiments of the blocking device 26 are represented in FIGS. 9 and 10, these respectively being provided with a blocking element 25 in the form of a vertically movable plate 41. In a fashion analogous to the pivotable wing flap 31 (in accordance with FIG. 5), the plate 41 can be moved from an open position located between the transport elements 10 (corresponds to the representations in FIGS. 9 and 10) via the drive 28, generating a lifting movement (arrow 42, 42'), into a receiving pocket 43 located above the transport track 11, so that the height 24 of the corresponding workpiece passing opening is completely covered. In the embodiment in accordance with FIG. 9, the drive 28 is formed by a horizontally arranged operating cylinder 44 whose pushing and pulling movements (arrows 45, 45') effect the vertical movement of the plate 41 via a pivoting movement (arrow 47) via crank parts 46. In the embodiment in accordance with FIG. 10, the drive 28 is formed by a positioning motor 48 whose belt drive 49 effects the pivoting or rotary movement (arrow 47') of the crank parts 46, so that the plate 41 can be moved vertically upwards and downwards.

In the closed position (not represented), the plate 41 engages in the region of the receiving pocket 43 between two plate parts 50, 51, which are arranged essentially parallel and whose shielding action can be improved by an additional lead coating on the outside. The receiving pocket 43 can be provided in the region of the inside with additional sealing parts, so that in the closed position the receiving pocket 43 forms a gas-tight engagement with the plate 41.

Figure 7:
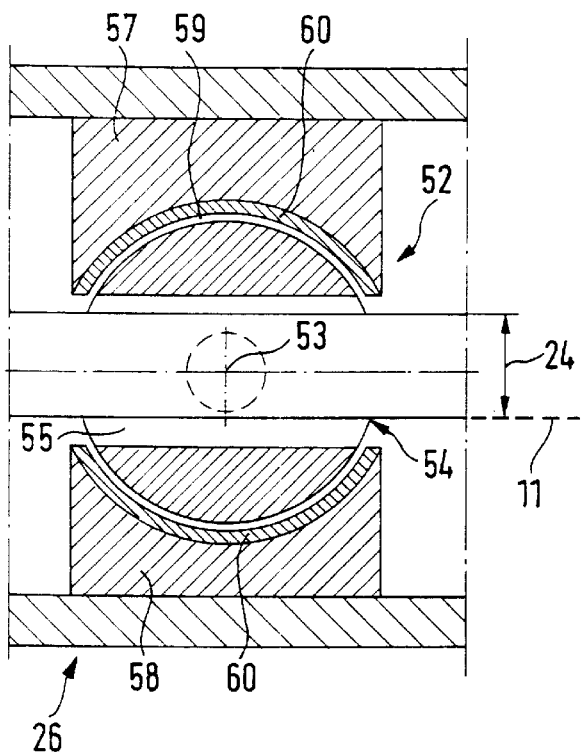
FIG. 7.
Figure 8:
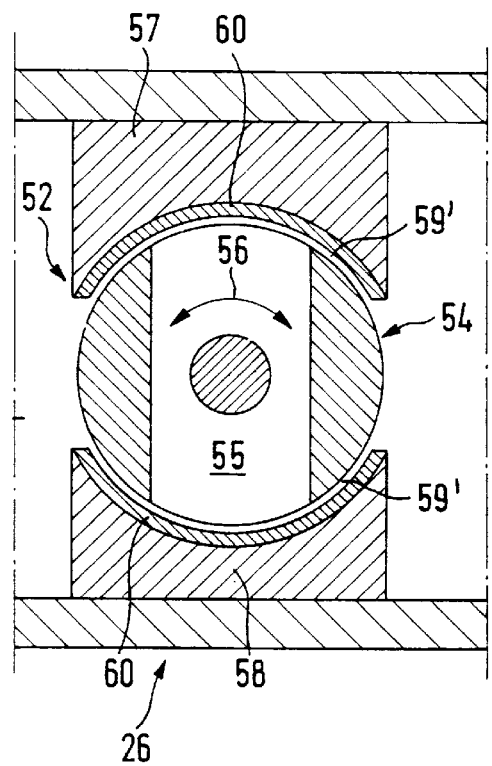
FIG. 8 show enlarged detailed representations of the blocking device in a second embodiment in the manner of a stopcock, in different operating positions.

A further embodiment of the blocking device 26 and the design of the blocking element 25 are shown in FIG. 7 and FIG. 8, these being constructed as a constructional unit in the manner of a stopcock 52 whose horizontal axis 53 extends in the region of the transport track 11. The stopcock 52 is provided with a plug part 54, which essentially has a cylindrical cross-sectional contour and is provided with a longitudinal slot 55 extending essentially over the width 31 of the transport device 4 (FIG. 4). The representation in accordance with FIG. 7 illustrates that the plug part 54, pivoted into a horizontal open position, defines the passing cross-section, or the height 24 thereof, in the region of the longitudinal slot 55. The corresponding passage of the workpiece is performed in this operating position, and thereafter the plug part 54 can be pivoted by one of the drives 28 previously described (not represented here) into the closed position in accordance with FIG. 8 (arrow 56), so that the intended horizontal shielding is achieved in the region of the passing cross-section.

Preferably, the plug part 54 is arranged between an upper and a lower shielding strip 57, 58, so that a minimum sealing gap region 59 additionally remains between the plug part 54 and the two shielding strips 57, 58. The shielding strips 57, 58 are additionally designed with a concave cross-sectional profile region which partly receives the cylindrical plug part 54, with the result that the sealing action in the region of the stopcock 52 is improved overall by virtue of an arcuate design of the gap 59. Moreover, a flexible coating 60 may be provided in the region of the respective gap 59 so that the gap 59' can be reduced to a minimum when the contour of the plug part 54 bears arcuately thereon in the closed position (FIG. 8) and thus the gas-tight sealing is achieved in addition to shielding off the scattered radiation.

Figure 11:
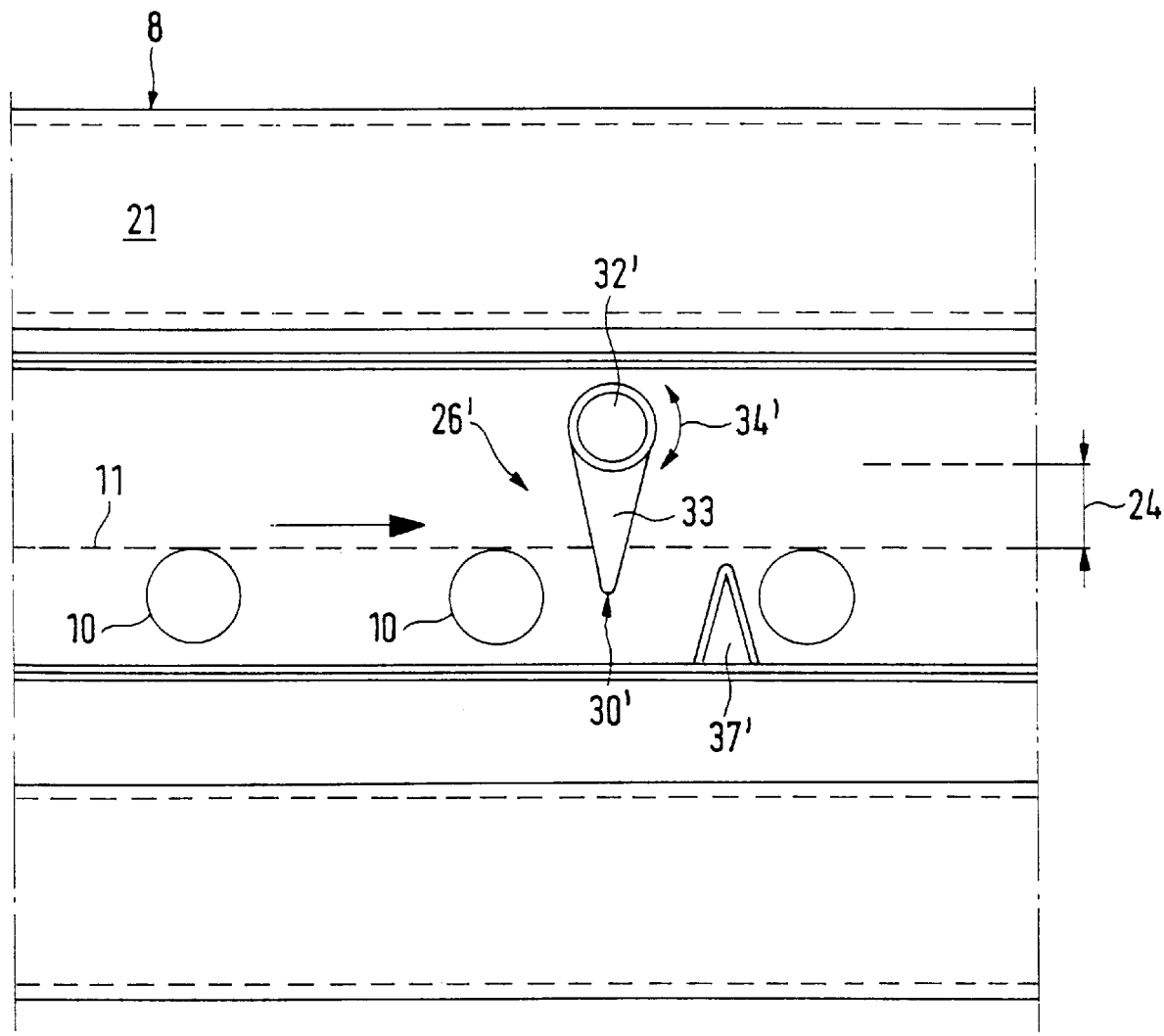
FIG. 11 shows an enlarged detailed representation of the blocking device in an embodiment similar to FIG. 5, the blocking element being arranged above the transport track.

A blocking device 26' in another embodiment is represented in FIG. 11. This blocking device 26' is designed as a constructional unit which is arranged above the transport track 11 and cooperates with corresponding drive elements (not represented) in such a way that the previously described actions as horizontal shield and gas sealing are achieved by appropriate control of the blocking element 25.

Figure 6:
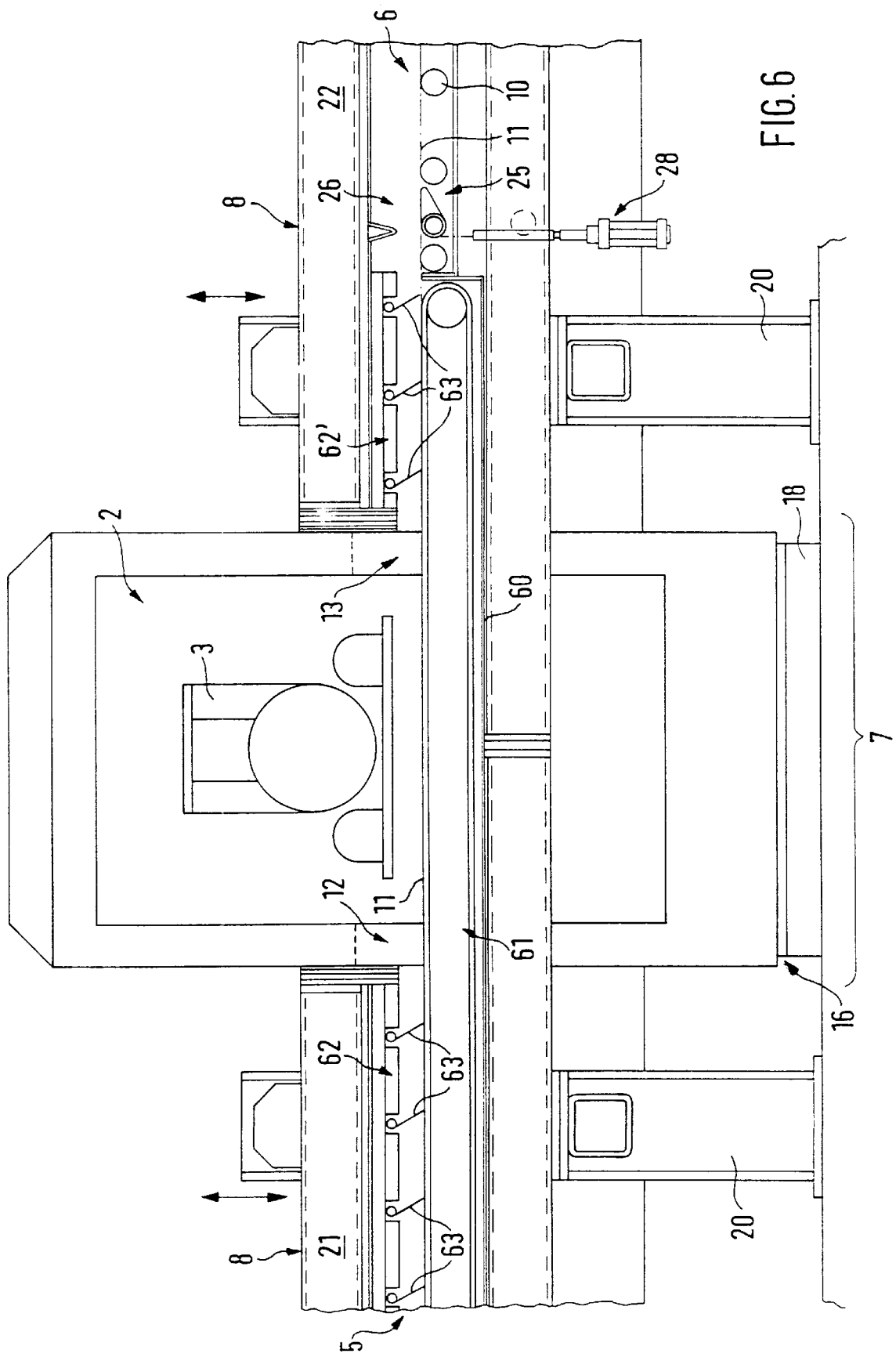
FIG. 6 shows an enlarged representation of a detail of the electron-beam system in the region of the irradiation chamber and of the feed and discharge sections of the transport device.

The transition region of the feed and discharge openings 12, 13 to the corresponding sections 5, 6 of the transport device 4 is shown in more detail in FIG. 6, wherein an advantageous design of the processing section 7 is shown. A conveying track 61 is extended so far on both sides of the irradiation chamber 2 above a braking trough 60 that this conveying track 61 terminates in a region below the lifting unit 21 or 22, that is to say outside the irradiation chamber. Provided in this region are respective flow obstacles 62, 62', which reach in the operating position as far as into the region of the transport track 11. These obstacles 62, 62', provided for sealing and/or restricting the protective gas flowing out of the irradiation chamber 2, in this case form with respective pivotable wings 63 an additional stagnation zone in the near zone of the irradiation chamber 2, with the result that it is possible for the consumption of protective gas by the electron-beam system 1 to be further reduced overall even in the case of a high gas pressure in the irradiation chamber 2.

I claim:
1. An electron-beam system for curing plastic layers on workpieces, the electron-beam system comprising:
    an irradiation chamber,
    an electron gun for generating at least one electron beam in the irradiation chamber,
    a transport device having a feed section, a processing section and a discharge section for conveying workpieces along a conveying path into, through and out respectively of the irradiation chamber, and
    a radiation barrier extending alone the feed section and the discharge section, wherein the barrier includes two or more movable blocking devices on each of the feed section and the discharge section and wherein the blocking devices are spaced along the conveying path of the transport device such that a set of one or more workpieces fits between a pair of blocking devices on the feed section and the same set of one or more workpieces fits between a pair of blocking devices on the discharge section, and
    wherein each blocking device is movable between a closed position which obstructs the conveying path and blocks radiation from the irradiation chamber and an open position which permits passage of a workpiece along the conveying path.
2. The electron-beam system according to claim 1, wherein more than two blocking devices are arranged along the conveying path of the transport device upstream of the irradiation chamber.
3. The electron-beam system according to claim 1, wherein more than two blocking devices are arranged along the conveying path of the transport device downstream of the irradiation chamber.
4. The electron-beam system according to claim 1, wherein the radiation barrier includes two or more shields which cover the transport device upstream and downstream of the irradiation chamber, and wherein the spacing between each shield and the transport device is adjustable.
5. The electron-beam system according to claim 1, wherein by means of a framework supporting it, the electron gun can be displaced transversely to the conveying path of the transport device out of the irradiation chamber and into a position in which it is accessible for maintenance and repair work.
6. The electron-beam system according to claim 1, wherein the feed section and discharge section are comprised of horizontal transport tracks for the workpieces upstream of and downstream respectively of the irradiation chamber.
7. The electron-beam system according to claim 1, wherein at least one blocking device is comprised of a pivotable flap extending across the width of the conveying path.
8. The electron-beam system according to claim 1, wherein at least one blocking device is comprised of a plate extending across the width of the conveying path and is movable in a direction transverse to the conveying path.
9. The electron-beam system according to claim 1, wherein at least one blocking device is comprised of a rotatable stop cock extending across the width of the conveying path.

* * * * *

UNITED STATES PATENT AND TRADEMARK OFFICE
CERTIFICATE OF CORRECTION

PATENT NO. : 5,981,963
DATED      : November 9, 1999
INVENTOR(S): Franz Kampmeier It is certified that error appears in the above-identified patent and that said Letters Patent is hereby corrected as shown below:

Title Page, [56] References Cited, insert:
-- FOREIGN PATENT DOCUMENTS
    1764592    7/1971    Germany
    2004050    5/1971    Germany
    4405500    8/1995    Germany
    4406887    6/1995    Germany
  OTHER REFERENCES
    Patent Abstracts of Japan, Vol. 004, No. 026, Publication No. 55001815 dated 09-01-80. --.

Column 3 Line 19, after "area" insert comma -- , --.

Signed and Sealed this

Fifth Day of September, 2000

Attest:

Q. TODD DICKINSON

Attesting Officer

Director of Patents and Trademarks